(12) United States Patent
Ren et al.

(10) Patent No.: US 11,116,099 B2
(45) Date of Patent: Sep. 7, 2021

(54) RIVETED METAL MIDDLE FRAME AND ELECTRONIC DEVICE

(71) Applicant: GUANGDONG EVERWIN PRECISION TECHNOLOGY CO., LTD., Dongguan (CN)

(72) Inventors: Xiangsheng Ren, Dongguan (CN); Lidong Wang, Dongguan (CN); Lilei Wang, Dongguan (CN); Ke Zhang, Dongguan (CN); Hao Huang, Dongguan (CN)

(73) Assignee: GUANGDONG EVERWIN PRECISION TECHNOLOGY CO., LTD., Guangdong (CN)

( * ) Notice: Subject to any disclaimer, the term of this patent is extended or adjusted under 35 U.S.C. 154(b) by 420 days.

(21) Appl. No.: 16/088,396

(22) PCT Filed: Mar. 9, 2018

(86) PCT No.: PCT/CN2018/078548
§ 371 (c)(1),
(2) Date: Sep. 25, 2018

(87) PCT Pub. No.: WO2019/140765
PCT Pub. Date: Jul. 25, 2019

(65) Prior Publication Data
US 2021/0105905 A1 Apr. 8, 2021

(30) Foreign Application Priority Data

Jan. 17, 2018 (CN) .......................... 201810044378.X
Jan. 17, 2018 (CN) .......................... 201810044380.7
(Continued)

(51) Int. Cl.
*H05K 5/04* (2006.01)

(52) U.S. Cl.
CPC ..................................... *H05K 5/04* (2013.01)

(58) Field of Classification Search
CPC .......................................................... H05K 5/04
See application file for complete search history.

(56) References Cited

U.S. PATENT DOCUMENTS 8,320,978 B2 * 11/2012 Chang ................. H04M 1/0266
455/575.1
8,933,347 B2 * 1/2015 Kiple ....................... H01Q 1/42
174/541
(Continued)

FOREIGN PATENT DOCUMENTS

CN 103974576 A 8/2014
CN 104068595 A 10/2014
(Continued)

OTHER PUBLICATIONS

International Search Report for Application No. PCT/CN2018/078548 dated Sep. 29, 2018.
(Continued)

*Primary Examiner* — Hung V Ngo
(74) *Attorney, Agent, or Firm* — Leydig, Voit & Mayer, Ltd.

(57) ABSTRACT

Provided is a riveted metal middle frame including a middle plate and a border frame riveted to the middle plate. The middle plate is made of aluminum alloy, and the periphery of the middle plate is convexly provided with convex edge. The border frame includes members connected end to end in sequence. The members are made of metal material with hardness not less than aluminum alloy, and are riveted to the periphery of the middle plate; and the inner sides of the members are respectively provided with slots for connecting the convex edge. The convex edge is riveted to the slot by press-fitting the border frame. Meanwhile, an electronic device including the above-described riveted metal middle (Continued)

frame is also provided. The beneficial effects are that the middle plate and the border frame are riveted together by press-fitting deformation, thereby improving production efficiency and reducing manufacturing cost.

19 Claims, 12 Drawing Sheets

(30) Foreign Application Priority Data

Jan. 17, 2018 (CN) .......................... 201810045228.0
Jan. 17, 2018 (CN) .......................... 201820083081.X

(56) References Cited

U.S. PATENT DOCUMENTS

| | | | | |
|---|---|---|---|---|
| 9,287,627 B2* | 3/2016 | Jarvis | ..................... | H01Q 1/243 |
| 9,655,261 B2* | 5/2017 | Wu | ....................... | G06F 1/1626 |
| 2011/0255218 A1* | 10/2011 | Pakula | ................ | H04M 1/0249 |
| | | | | 361/679.01 |
| 2013/0257659 A1* | 10/2013 | Darnell | ................. | H05K 1/181 |
| | | | | 343/702 |

FOREIGN PATENT DOCUMENTS

| | | |
|---|---|---|
| CN | 104853549 A | 8/2015 |
| CN | 104955307 A | 9/2015 |
| CN | 205195780 U | 4/2016 |
| CN | 106211643 B | 12/2016 |
| CN | 106304707 A | 1/2017 |
| CN | 106862399 A | 6/2017 |
| CN | 106863925 A | 6/2017 |
| CN | 107087365 A | 8/2017 |
| CN | 107087366 A | 8/2017 |
| CN | 206413054 U | 8/2017 |
| CN | 107414333 A | 12/2017 |
| CN | 107426369 A | 12/2017 |
| EP | 0744241 B1 | 11/2001 |

OTHER PUBLICATIONS

Chinese Office Action related to Chinese Application No. 201810044378.X dated May 5, 2019.
Chinese Office Action related to Chinese Application No. 201810044380.7 dated May 5, 2019.
Chinese Office Action related to Chinese Application No. 201810045228.0 dated May 23, 2019.

* cited by examiner

RIVETED METAL MIDDLE FRAME AND ELECTRONIC DEVICE

CROSS-REFERENCE TO RELATED APPLICATION

The present application is a continuation application of International Application No. PCT/CN2018/078548, filed on Mar. 9, 2018, which claims the benefit of Chinese Patent Application No. 2018100452280, filed on Jan. 17, 2018, entitled "Steel-Aluminum Riveted Metal Middle Frame and Electronic Device", Chinese Patent Application No. 2018100443807, filed on Jan. 17, 2018, entitled "Aluminum-Aluminum Riveted Metal Middle Frame and Electronic Device", Chinese Patent Application No. 201810044378X, filed on Jan. 17, 2018, entitled "Titanium-Aluminum Riveted Metal Middle Frame and Electronic Device", and Chinese Patent Application No. 201820083081X, filed on Jan. 17, 2018, entitled "Metal Middle Frame and Electronic Device", the entire content of which are incorporated herein in their entireties.

TECHNICAL FIELD

The present disclosure relates to the technical field of middle frame manufacturing, and more particularly, to a riveted metal middle frame and an electronic device using the riveted metal middle frame.

BACKGROUND

With the continuous development of mobile terminal technology, the application of electronic devices such as smart phones, PDAs, smart watches and the like has been extremely popular and has become an important part of people's work and life. The housing of electronic devices usually adopts a metal middle frame structure. The metal middle frame structure has the advantages of wear resistance and easy heat dissipation, and at the same time it enables the product to make a high-end impression to users.

The metal middle frame structure mainly comprises a metal border frame and a middle plate. For the conventional metal middle frame structure, it generally forms a prototype of a metal middle frame integrally by means of forging a stainless steel blank, and then it performs a CNC finishing on the prototype of the metal middle frame. On the one hand, this method, which performs the CNC finishing after the blank forming, requires more waste to be cutting off, thus more material will be wasted. On the other hand, the hardness of the stainless steel blank is relative high, thus the loss of the cutting tool during finishing is high, and the speed is relative slow. The above problems result in a low production efficiency of conventional metal frame production, and it is difficult to reduce the manufacturing cost.

SUMMARY

Accordingly, the present disclosure provides a riveted metal middle frame, which improves production efficiency and reduces manufacturing cost by means of that a middle plate made of aluminum alloy and a border frame made of stainless steel are riveted together by press-fitting deformation.

A riveted metal middle frame, comprising:

a middle plate, wherein the middle plate is made of aluminum alloy, and a periphery of the middle plate is convexly provided with a convex edge; and a border frame riveted to the middle plate, wherein the border frame comprises a plurality of members connected end to end in sequence. The plurality of members are connected end to end to form an enclosure frame structure sleeved on the periphery of the middle plate; the members are made of metal material with hardness not less than aluminum alloy; the members are riveted to the periphery of the middle plate; an inner side of the members are respectively provided with a slot for connecting the convex edge; the convex edge and the border frame are deformed by press-fitting the border frame to achieve a seamless connection between the convex edge and the slot.

The abovementioned riveted metal middle frame adopts press-fitting to realize riveting between the middle plate and the border frame to form a middle frame. Wherein, the middle plate is made of aluminum alloy, and the border frame is made of metal material with hardness not less than aluminum alloy. During processing, the middle plate made of aluminum alloy can reduce the loss of the cutting tool and be conducive to improve the speed for milling-finishing. The border frame comprises a plurality of members connected end to end, and the inner sides of the members are provided with slots, and correspondingly, the periphery of the middle plate is provided with a convex edge. During assembly, the members are pressed against the periphery of the middle plate from an outer side of the middle plate. Then, a riveted state between the convex edge and the slots can be achieved by press-fitting the border frame. This way of assembly can reduce the amount of finishing work and generated waste. By the above design, the middle plate and the border frame are riveted together by press-fitting deformation, thereby improving production efficiency and reducing manufacturing cost.

In one of the embodiments, the members are connected together by welding.

In one of the embodiments, a gap is provided on a joint between two adjacent members, and the gap is filled with a solder.

In one of the embodiments, the number of members is two and the members comprise a first member and a second member, the first member and the second member are both provided with a U-shaped structure.

In one of the embodiments, the length of the first member after being unfolded into a linear shape is less than the length of the second member after being unfolded into a linear shape.

In one of the embodiments, the first member is provided with a three-segment structure and comprises a first straight segment, a first arc segment connected to one end of the first straight segment, and a second arc segment connected to another end of the first straight segment, the second member is provided with a five-segment structure and comprises a second straight segment, a third arc segment connected to one end of the second straight segment, a fourth arc segment connected to another end of the second straight segment, a third straight segment connected to an end of the third arc segment away from the second straight segment, and a fourth straight segment connected to an end of the fourth arc segment away from the second straight segment, one end of the third straight segment away from the third arc segment is connected to the first arc segment, and one end of the fourth straight segment away from the fourth arc segment is connected to the second arc segment.

In one of the embodiments, the number of members is four and the members comprise a third member, a fourth member, a fifth member, and a sixth member that are connected end to end in sequence.

In one of the embodiments, the third member and the fifth member are both provided with U-shaped structure, and the fourth member and the sixth member are both provided with a straight sheet structure.

In one of the embodiments, the length of the third member after being unfolded into a linear shape is equal to the length of the fifth member after being unfolded into a linear shape, the fourth member and the sixth member are of equal length, the length of the fourth member is greater than the length of the third member after being unfolded into a linear shape.

A riveted metal middle frame, comprising:

a middle plate, wherein the middle plate is made of aluminum alloy, and a periphery of the middle plate is convexly provided with a convex edge; and a border frame riveted to the middle plate, wherein the border frame comprises a plurality of members sleeved on a periphery of the middle plate, the plurality of the members are separated from each other to form at least two gaps, the member is made of a metal material with a hardness not less than that of aluminum alloy, the member is riveted to the periphery of the middle plate, an inner side of the member is respectively provided with a slot for connecting the convex edge, and the convex edge is riveted to the slot by press-fitting the border frame.

In one of the embodiments, the number of members is two and the members comprise a first member and a second member, the first member and the second member are both provided with a U-shaped structure.

In one of the embodiments, the length of the first member after being unfolded into a linear shape is less than the length of the second member after being unfolded into a linear shape.

In one of the embodiments, the first member is provided with a three-segment structure and comprises a first straight segment, a first arc segment connected to one end of the first straight segment, and a second arc segment connected to another end of the first straight segment, the second member is provided with a five-segment structure and comprises a second straight segment, a third arc segment connected to one end of the second straight segment, a fourth arc segment connected to another end of the second straight segment, a third straight segment connected to an end of the third arc segment away from the second straight segment, and a fourth straight segment connected to an end of the fourth arc segment away from the second straight segment, one end of the third straight segment away from the third arc segment is faced to the first arc segment, and one end of the fourth straight segment away from the fourth arc segment is faced to the second arc segment.

In one of the embodiments, the number of members is four and the members comprise a third member, a fourth member, a fifth member, and a sixth member that are connected end to end in sequence.

In one of the embodiments, the third member and the fifth member are both provided with U-shaped structure, and the fourth member and the sixth member are both provided with a straight sheet structure.

In one of the embodiments, the length of the third member after being unfolded into a linear shape is equal to the length of the fifth member after being unfolded into a linear shape, the fourth member and the sixth member are of equal length, the length of the fourth member is greater than the length of the third member after being unfolded into a linear shape.

In one of the embodiments, in manufacturing process, the members are connected together by welding or locking, and formed at least two connecting portions therein.

In one of the embodiments, the connecting portions are cut by milling tool to form the gaps for separating the members from each other.

Meanwhile, the present disclosure also provides an electronic device comprising the riveted metal middle frame of any of the above.

BRIEF DESCRIPTION OF DRAWINGS

In order to more clearly illustrate the embodiments of the present disclosure or the technical solutions in the prior art, the drawings used in the description of the embodiments will be briefly described below. It is obvious that the drawings in the following description are only the embodiments of the present disclosure, and for those of ordinary skill in the art, the drawings of other embodiments may be obtained from the drawings without the creative efforts.

Figure 1:
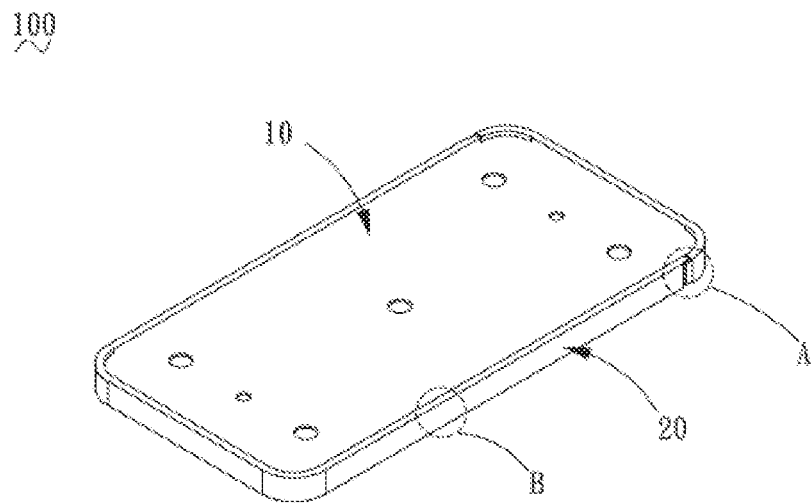
FIG. 1 is a schematic view of a riveted metal middle frame according to a first embodiment of the present disclosure.
Figure 2:
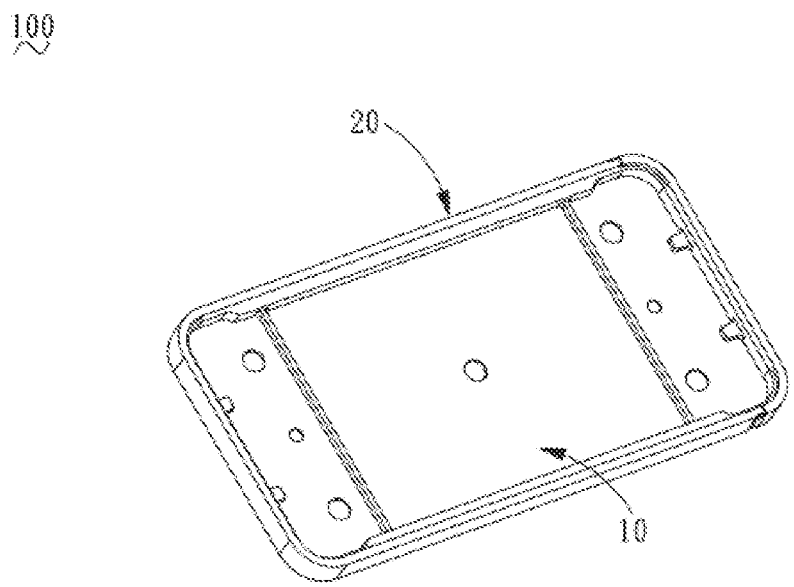
FIG. 2 is a schematic view of the riveted metal middle frame of FIG. 1 after being inverted.
Figure 3:
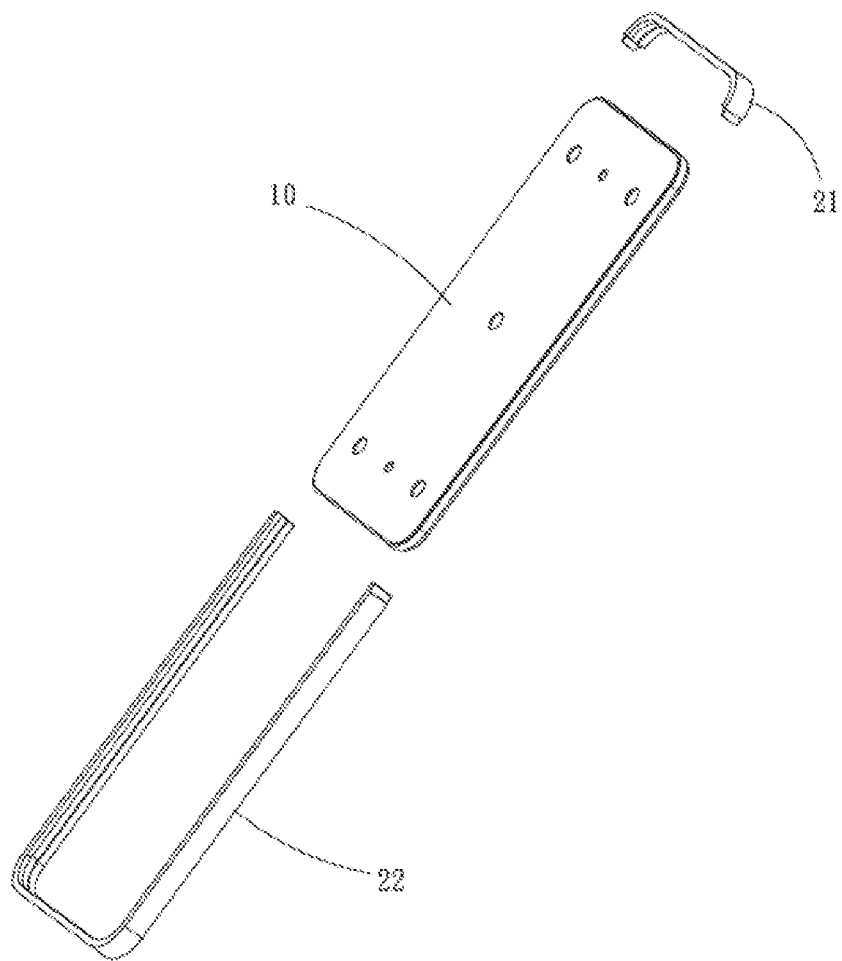
FIG. 3 is an exploded, schematic view of the riveted metal middle frame of FIG. 1.
Figure 4:
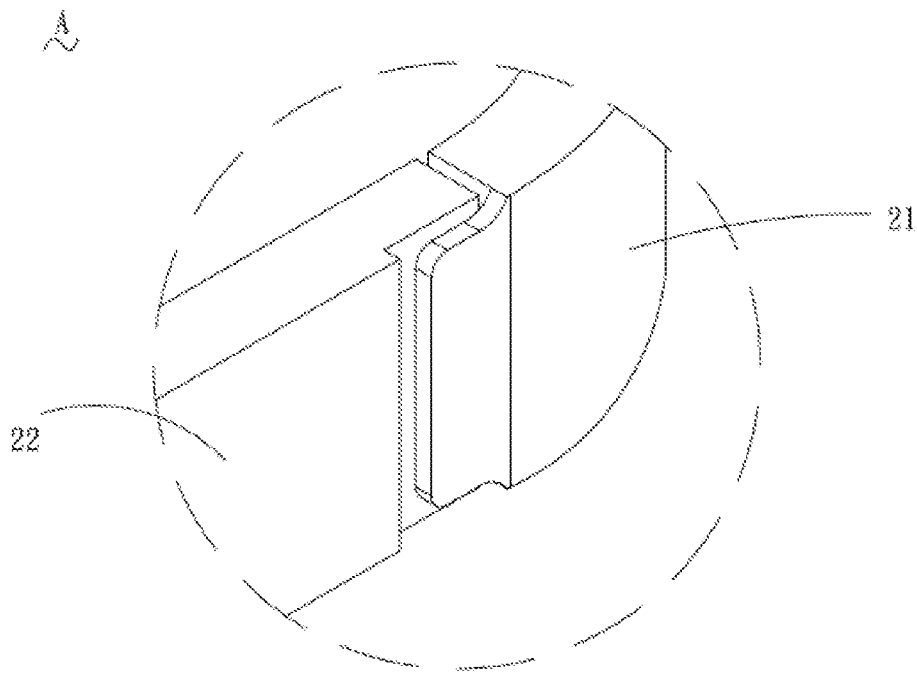
FIG. 4 is a partial enlarged schematic view for a portion A of the riveted metal middle frame of FIG. 1.

The meaning of each reference numeral in the drawing is:

(100, 100a)—riveted metal middle frame;

(10, 10a, 10b)—middle plate, (11, 11a, 11b)—convex edge, 12—positioning hole, 13—first rib, 14—second rib, 15—groove;
(20, 20a, 20b)—border frame, 21—first member, 22—second member, (23, 23a, 23b)—slot, 24—first connecting portion, 25—second connecting portion, 26-a straight segment, 27—first arc segment, 28—second arc segment, 29—second straight segment, 210—third arc segment, 211—fourth arc segment, 212—third straight segment, 213—fourth straight segment, 214—first slot, 215—second slot, 216—third member, 217—fourth member, 218—fifth member, 219—sixth member, 220—fifth straight segment, 221—fifth arc segment, 222—sixth arc segment, 223—sixth straight segment, 224—seventh arc segment, 225—eighth arc segment, 226—convex teeth.

DETAILED DESCRIPTION

In order to facilitate the understanding of the present disclosure, the present disclosure will be more fully described below. However, the invention may be embodied in many different forms and is not limited to the embodiments described herein. Rather, these embodiments are provided so that the understanding of the disclosure of the present disclosure will be more thorough.

All technical and scientific terms used herein have the same meaning as commonly understood by one of ordinary skill in the art, unless otherwise defined. The terms used herein in the specification of a back-up battery is for the purpose of describing the specific embodiments and is not intended to limit the present disclosure. The term "and/or" used herein comprises any and all combinations of one or more of the associated listed items.

A riveted metal middle frame comprises a middle plate and a border frame riveted to the middle plate.

The middle plate is made of aluminum alloy, and the periphery of the middle plate is convexly provided with convex edge.

The border frame comprises a plurality of members connected end to end in sequence. The pluralities of members are connected end to end to form an enclosure frame structure sleeved on the periphery of the middle plate. The members are made of metal material with hardness not less than aluminum alloy. The members are riveted to the periphery of the middle plate. The inner sides of the members are respectively provided with slots for connecting the convex edge. The convex edge and the border frame are deformed by press-fitting the border frame to achieve a seamless connection between the convex edge and the slots.

The abovementioned riveted metal middle frame adopts press-fitting to realize riveting between the middle plate and the border frame to form a middle frame. Wherein, the middle plate is made of aluminum alloy, and the border frame is made of metal material with hardness not less than aluminum alloy. When processing, the middle plate made of aluminum alloy can reduce the loss of the cutting tool and be conducive to improve the speed for milling-finishing. The border frame comprises a plurality of members connected end to end, and the inner sides of the members are provided with slots, and correspondingly, the periphery of the middle plate is provided with a convex edge. During assembling, the members are pressed against the periphery of the middle plate from the outer sides of the middle plate. Then, a riveted state between the convex edge and the slot can be achieved by press-fitting the border frame. This way of assembly can reduce the amount of finishing work and waste generated. In the above design, the middle plate and the border frame are riveted together by press-fitting deformation, thereby improving production efficiency and reducing manufacturing cost.

Four embodiments are provided below to illustrate the technical solution of the present disclosure.

The First Embodiment

Referring to FIG. 1 to FIG. 11, it is a schematic view of a riveted metal middle frame 100 according to the present embodiment.

As shown in FIGS. 1 to 5, the riveted metal middle frame 100 comprises a middle plate 10 and a border frame 20 riveted to the middle plate 10.

Figure 6:
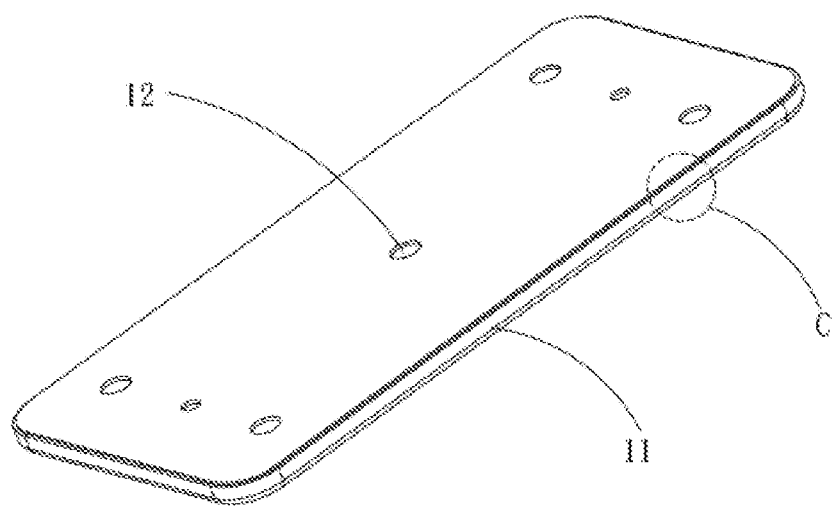
FIG. 6 is a schematic view of a middle plate of the riveted metal middle frame of FIG. 3.
Figure 7:
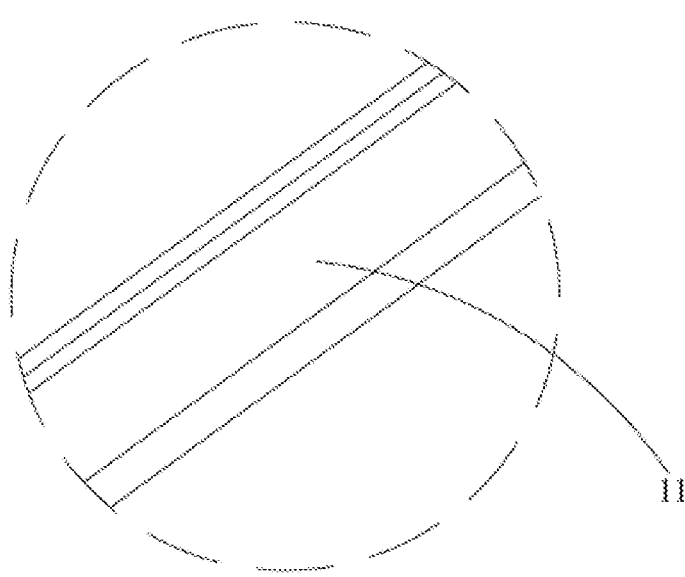
FIG. 7 is a partial enlarged schematic view for a portion C of the middle plate of FIG. 6.

As shown in FIG. 6 and FIG. 7, the middle plate 10 is made of an aluminum alloy material, and a convex edge 11 is convexly provided on the periphery of the middle plate 10. The convex edge 11 is convexly provided on an outer side of the periphery of the middle plate 10. In the embodiment, the middle plate 10 may further be provided with a positioning hole 12 for cooperating with a fixture during processing.

Figure 5:
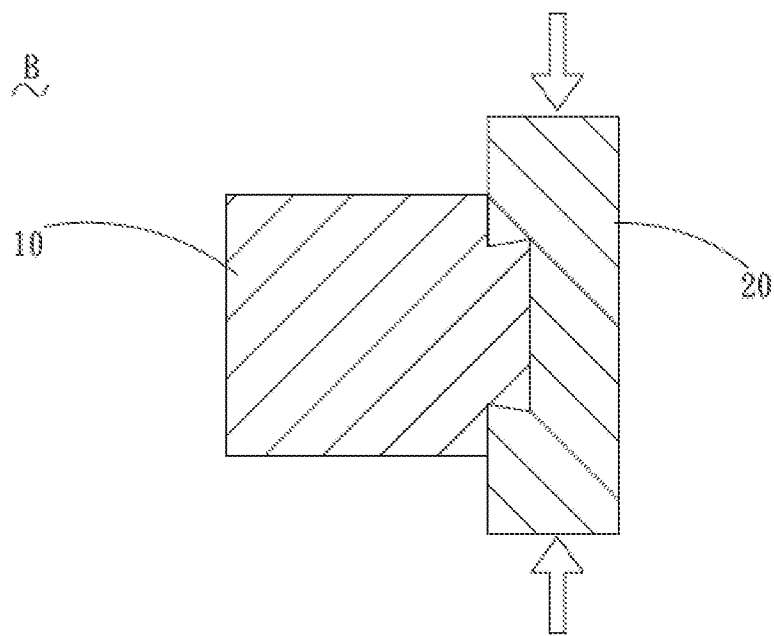
FIG. 5 is a partial enlarged sectional schematic view for a portion B of the riveted metal middle frame of FIG. 3.

As shown in FIGS. 8 to 11, the border frame 20 comprises a plurality of members connected end to end in sequence. The pluralities of members are connected end to end to form a enclosure frame structure sleeved on the periphery of the middle plate 10. In the present embodiment, the number of members is two, that is, the border frame 20 comprises the first member 21 and the second member 22 connected with the first member 21. The first member 21 and the second member 22 are connected end to end to form an enclosure frame structure sleeved on the periphery of the middle plate 10. The first member 21 and the second member 22 are both made of stainless steel. The hardness of the first member 21 and the hardness of the second member 22 are both greater than the hardness of the middle plate 10. The first member 21 and the second member 22 are riveted to the periphery of the middle plate 10. The inner sides of the first member 21 and the second member 22 are respectively provided with slot 23 for connecting with the convex edges 11. The slot 23 has a configuration with a narrow opening end and a wide inner cavity. For example, in the embodiment, the slot 23 is a dovetail slot, the angle range between the oblique side and the bottom side thereof is preferably 45° to 85°, and in the embodiment, the angle is 80°. In other embodiments, the angle may also be any value within the range, such as 45°, 50°, 55°, 60°, 65°, 70° or 85°, and the like. The convex edge 11 and the border frame 20 are deformed by press-fitting the upper and lower end faces of the border frame 20 (the external force is applied in the direction of the arrow as shown in FIG. 5) to achieve the riveting between the convex edge 11 and the slot 23. It is to be noted that, before the press-fitting, the convex edge 11 is a boss structure with a rectangular section, and the slot 23 on the inner side of the border frame 20 is a groove structure with a dovetail section. The opening width of the slot 23 is slightly larger than the width of the convex edge 11, which allows the convex edge 11 to enter the slot 23 easily. After press-fitting, subject to the pressure, the border frame 20 is squashed with a certain amount, so that the convex edge 11 is deformed into a dovetail shape by pressing and is tightly engaged in the deformed dovetail slot 23 for the purpose of stabilizing the riveting.

In the present embodiment, the middle plate 10 is made of an aluminum alloy of the ADC12 type, and hardness thereof is between 90 HV and 100 HV. The first member 21 and the second member 22 are made of stainless steel of the SUS316 type, and the hardness thereof is between 180 HV and 220 HV, so that the difference in hardness between the border frame 20 and the middle plate 10 can be controlled between 80 HV and 130 HV, which is advantageous in that when the press-fitting is performed, both the border frame 20 and the convex edge 11 on the middle plate 10 can be deformed, and the deformation quantity of the convex edge 11 is slightly larger than the deformation quantity of the border frame 20, so that it is easier to be filled into the slot 23 when the convex edge 11 is deformed, and which is advantageous to the purpose of seamless riveting (it should be understood that, there may be a certain gap between the convex edge 11 and the slot 23 on the premise of ensuring the riveting stability between the border frame 20 and the middle plate 10). In other embodiments, other types of aluminum alloy and stainless steel may also be used for matching.

Wherein, the joint between two adjacent members may be combined by welding or riveting.

For example, as shown in the present embodiment, the first member 21 is connected to the second member 22 end to end by welding. After welding, in order to make a flat joint, a gap is provided on the joint of the first member 21 and the second member 22, and the gap is filled with a solder.

Furthermore, the structure of the joint between two adjacent members may also be provided in different implementations.

Figure 9:
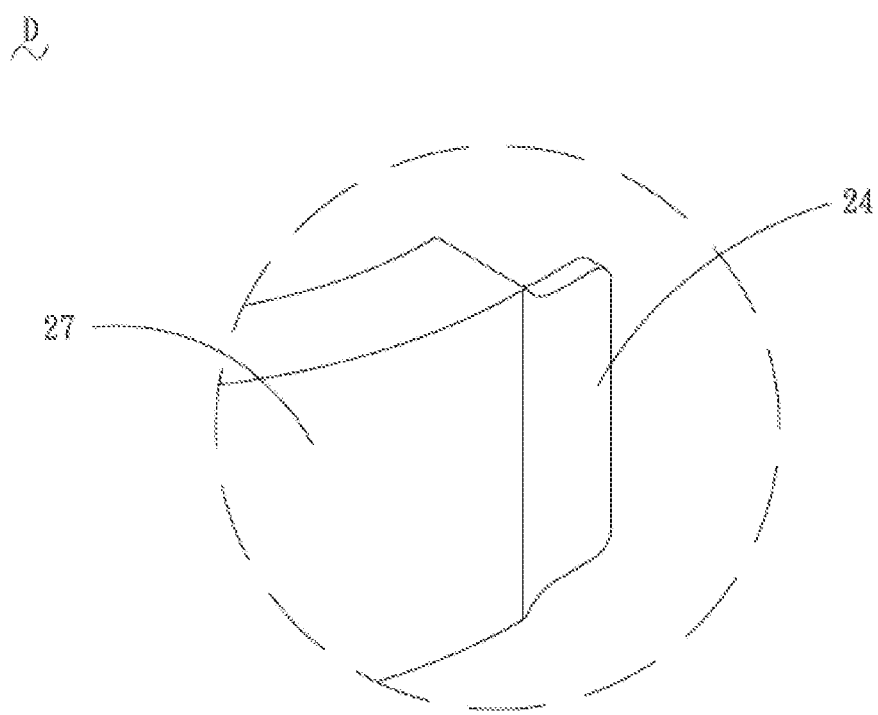
FIG. 9 is a partial enlarged schematic view for a portion D of the first member of FIG. 8.
Figure 11:
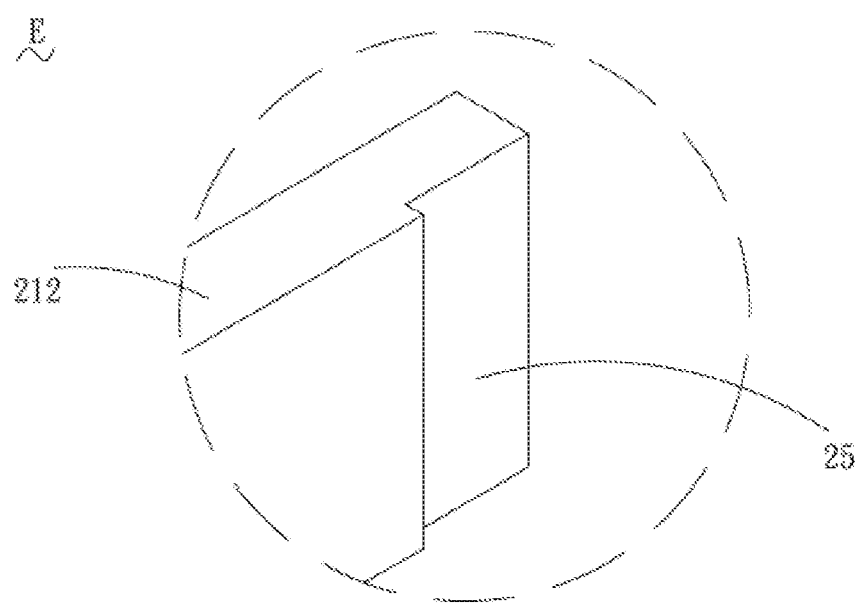
FIG. 11 is a partial enlarged schematic view for a portion E of the second member of FIG. 10.

For example, as shown in FIG. 9 and FIG. 11, in the present embodiment, the end of the first member 21 is provided with a first connecting portion 24. The end of the second member 22 is provided with a second connecting portion 25 that is connected to the first connecting portion 24. The first connecting portion 24 is a tab that is convexly provided on the end of the first member 21. The second connecting portion 25 is a step portion that matches with the tab. The inner side of the tab abuts against the outer side of the step portion, and a gap is reserved between the front end of the tab and the rear end of the step portion. Then, in combination with the welding method described above, a welding process is performed at the gap, and after the welding is completed, a grinding or milling treatment is performed for improving the flatness.

For another example, in other embodiments, the first connecting portion 24 may be designed as a bump, and the second connecting portion 25 is designed as a groove, and the first connecting portion 24 and the second connecting portion 25 are riveted with each other by press-fitting.

Furthermore, the specific shapes of the first member 21 and the second member 22 can be differently designed on the premise that the enclosure frame structure that is sleeved on the periphery of the middle plate 10 can be formed.

For example, the length of the first member 21 after being unfolded into a linear shape is equal to the length of the second member 22 after being unfolded into a linear shape, and the first member 21 and the second member 22 are designed as two symmetrically disposed U-shaped structures.

Figure 8:
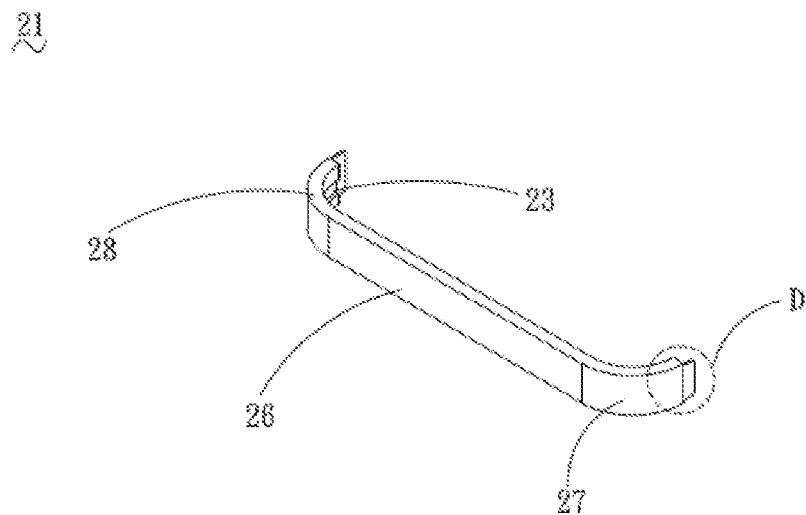
FIG. 8 is a schematic view of the first member of the border frame of the riveted metal middle frame of FIG. 3.
Figure 10:
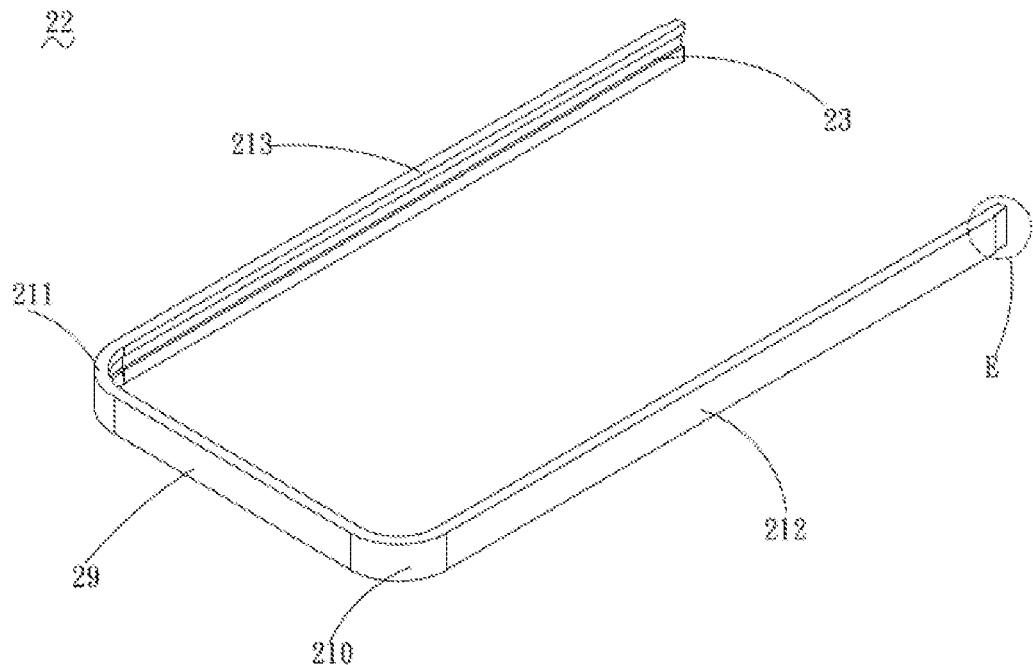
FIG. 10 is a schematic view of the second member of the border frame of the riveted metal middle frame of FIG. 3.

For another example, the length of the first member 21 after being unfolded into a linear shape can be less than the length of the second member 22 after being unfolded into a linear shape. Here, the specific implementation manner may also be various, for example, the first member 21 may be designed as a linear shape, and the second member 22 may be bent into an outer frame shape with a notch, wherein the width of the notch matches with the length of the first member 21. For another example, the first member 21 and the second member 22 are provided with two U-shaped structures with different sizes, which has the advantage that compared to a larger U-shaped structure, a smaller U-shaped structure is more stable and more difficult to be deformed. When the first member 21 is connected to the second member 22, the smaller U-shaped structure can be used to hoop the larger U-shaped structure. As a more preferred embodiment, as shown in FIG. 8 and FIG. 10, in the present embodiment, the first member 21 is a small U-shaped member, and the second member 22 is a large U-shaped member. Wherein, the first member 21 is provided with a three-segment structure and comprises a first straight segment 26, a first arc segment 27 connected to one end of the first straight segment 26, and a second arc segment 28 connected to another end of the first straight segment 26. The second member 22 is provided with a five-segment structure and comprises a second straight segment 29, a third arc segment 210 connected to one end of the second straight segment 29, a fourth arc segment 211 connected to another end of the second straight segment 29, a third straight segment 212 connected to an end of the third arc segment 210 away from the second straight segment 29, and a fourth straight segment 213 connected to an end of the fourth arc segment 211 away from the second straight segment 29. One end of the third straight segment 212 away from the third arc segment 210 is connected to the first arc segment 27, and one end of the fourth straight segment 213 away from the fourth arc segment 211 is connected to the second arc segment 28. The second straight line segment 29 and the first straight line segment 26 are of equal length. The first arc segment 27, the second arc segment 28, the third arc segment 210, and the fourth arc segment 211 are arc sheets with equal arc length and angle (it should be noted that, in this embodiment, the tabs mentioned above are connected to the ends of the first arc segment 27 and the second arc segment 28, however, this comparison among the first arc segment 27, the second arc segment 28, the third arc segment 210, and the fourth curved segment 211 does not consider the tabs). The first straight segment 26 and the second straight segment 29 are straight sheets that are parallel and equal in length. The third straight segment 212 and the fourth straight segment 213 are straight sheets that are parallel and equal in length. During assembling, the first member 21 and the second member 22 approach each other from both ends of the middle plate 10 for jointing. During jointing, the third straight segment 212 and the fourth straight segment 213 on the second member 22 are respectively hooped by the first arc segment 27 and the second arc segment 28 on the first member 21.

The abovementioned riveted metal middle frame 100 adopts press-fitting to realize riveting between the middle plate 10 and the border frame 20 to form a middle frame. Wherein, the middle plate 10 is made of aluminum alloy, and the border frame 20 is made of stainless steel, so that the hardness of the middle plate 10 is less than the hardness of the border frame 20. During processing, the middle plate 10 made of aluminum alloy can reduce the loss of the cutting tool and be conducive to improve the speed for milling-finishing. The border frame 20 comprises a plurality of members connected end to end, and the inner sides of the members are provided with slot 23, and correspondingly, the periphery of the middle plate 10 is provided with a convex edge 11. During assembling, the members are pressed against the periphery of the middle plate 10 from the outer sides of the middle plate 10. Then, the convex edge 11 and the border frame 20 are deformed at the same time by press-fitting the upper and lower end faces of the border frame 20, so that a riveted state between the convex edge 11 and the slot 23 can be achieved. This way of assembly can reduce the amount of finishing work and waste generated. In the above design, the middle plate 10 made of aluminum alloy and the border frame 20 made of stainless steel are riveted together by press-fitting deformation, thereby improving production efficiency and reducing manufacturing cost.

It should be noted that the riveting structure of the middle plate 10 and the border frame 20 shown in this embodiment is also applicable to the case where the border frame 20 is made of titanium alloy or aluminum alloy.

The Second Embodiment

The difference between this embodiment and the first embodiment is that the members are made of aluminum alloy, such as an ADC12 type aluminum alloy or an aluminum alloy with a hardness higher than that of the ADC12 type aluminum alloy, such that the hardness difference between the border frame 20 and the middle plate 10 is controlled between 0 HV to 50 HV. Before the press-fitting, the slot 23 is a groove structure with a rectangular section, and the convex edge 11 is a boss structure with a dovetail section, which is advantageous in that when the press-fitting is performed, the border frame 20 is deformed, and the deformation quantity of the convex edge 11 is relatively small, so that it easier to wrap the convex edge 11 when the frame 20 is deformed, and which is advantageous to the purpose of seamless riveting (it should be understood that, in some embodiments, on the premise of ensuring that the frame 20 and the middle plate 10 are firmly riveted, there may be a certain gap between the convex edge 11 and the slot 23 after press-fitting). it should be understood that, in other embodiments, other types of aluminum alloys may also be used for matching. Other structures are the same as those of the first embodiment, and the advantageous effects of the first embodiment can also be achieved.

The Third Embodiment

Referring to FIG. 12 to FIG. 18, it is a schematic view of a riveted metal middle frame 100a of the present embodiment.

Figure 12:
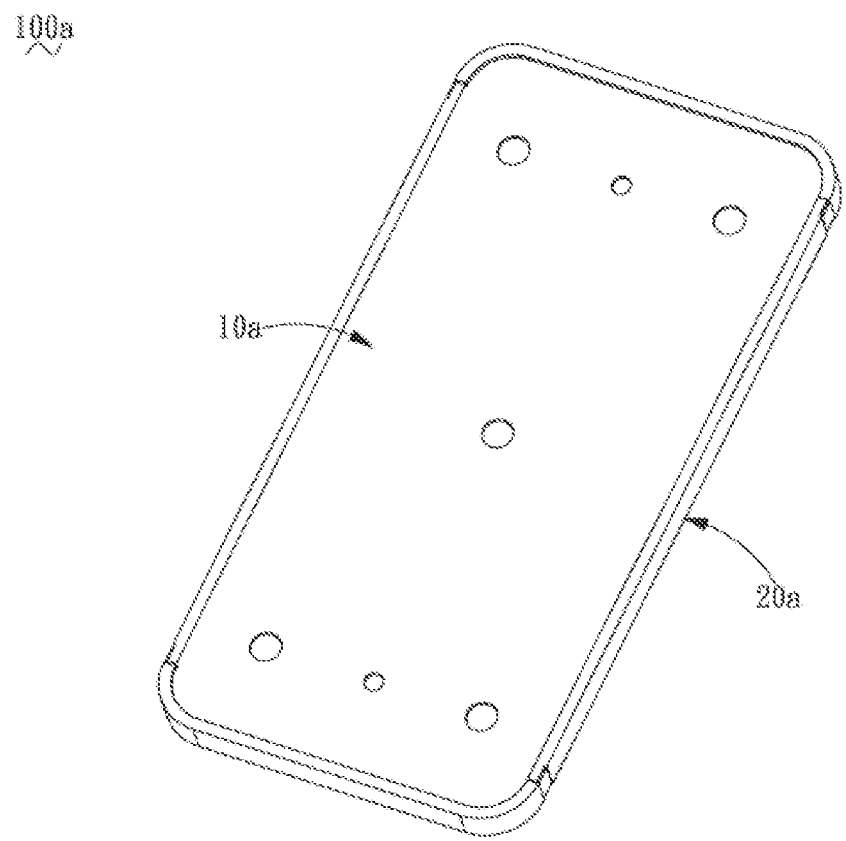
FIG. 12 is a schematic view of a riveted metal middle frame according to a third embodiment of the present disclosure.
Figure 13:
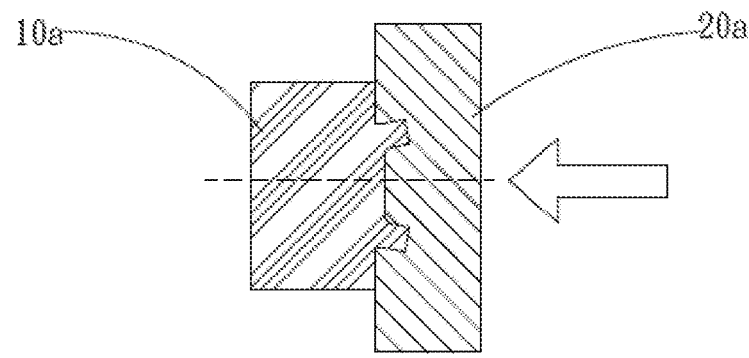
FIG. 13 is a sectional schematic view for joint of the middle plate and the border frame of the riveted metal middle frame of FIG. 12.
Figure 14:
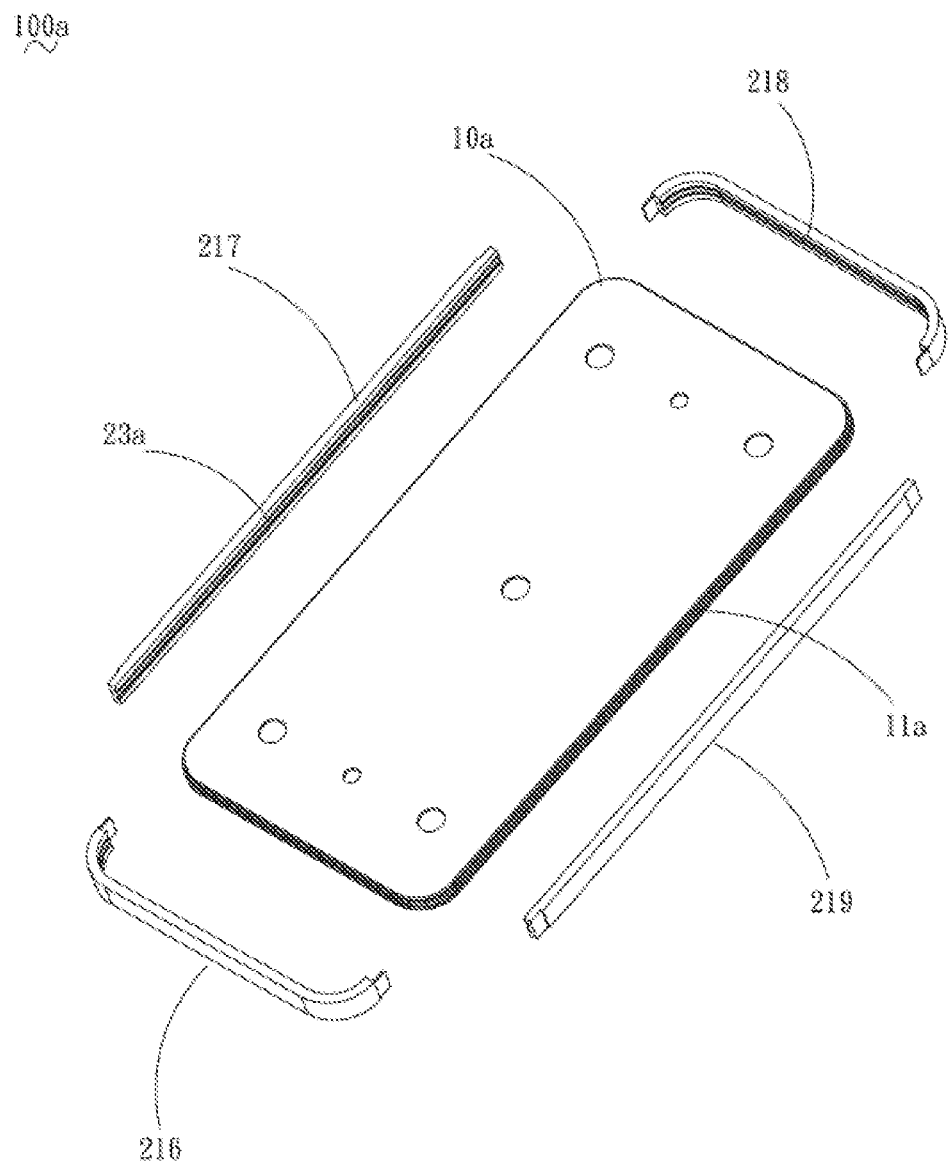
FIG. 14 is an exploded schematic view of the riveted metal middle frame of FIG. 12.

The difference between this embodiment and the first embodiment is that, as shown in FIG. 12 to FIG. 14, the border frame 20a comprises a plurality of members that are connected end to end in sequence. The pluralities of members are connected end to end to form an enclosure frame structure sleeved on the periphery of the middle plate 10a. All members are made of titanium alloy. For example, the members are made of titanium alloy of TC4 type, and the difference in hardness between the border frame 20a and the middle plate 10a can be controlled between 200 HV and 310 HV, which is advantageous in that when the pressing is performed, the middle plate 10a is deformed, and the border frame 20a is hardly deformed, so that the middle plate 10a is forced to be deformed by pressing the outer side of the border frame 20a and it is easier to fill the slot 23a, which is advantageous for the purpose of seamless connection.

Figure 15:
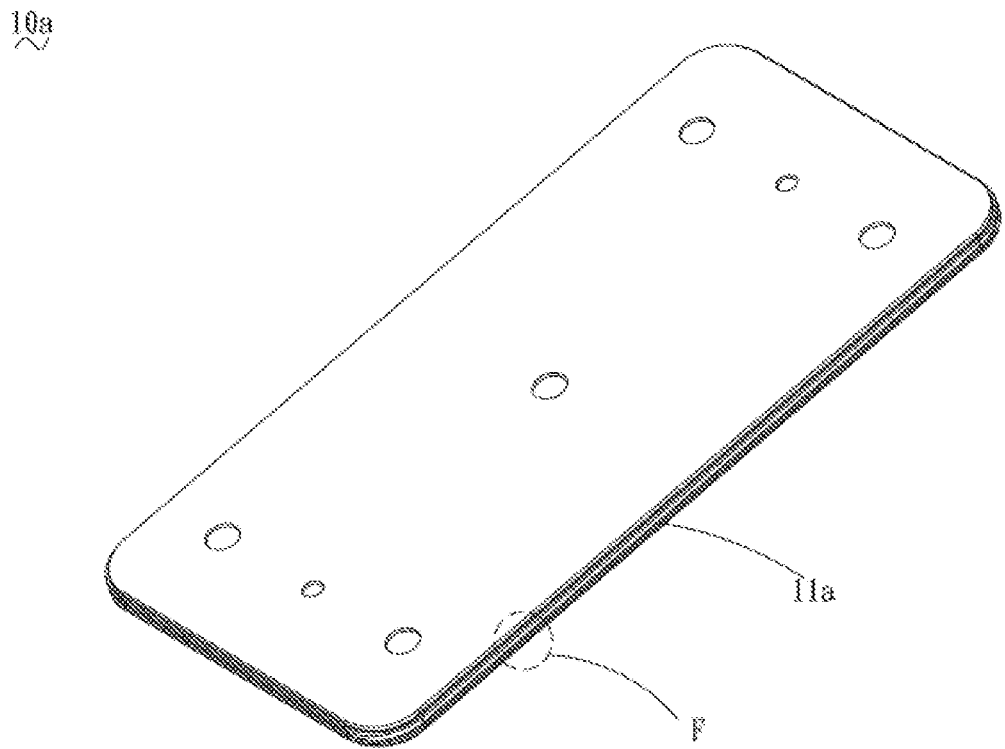
FIG. 15 is a schematic view of the middle plate of the riveted metal middle frame of FIG. 14.
Figure 16:
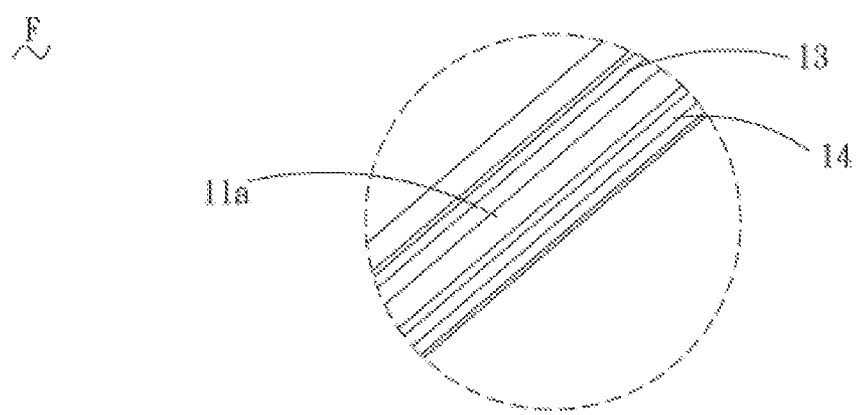
FIG. 16 is a partial enlarged schematic view for a portion F of the middle plate of FIG. 15.
Figure 19:
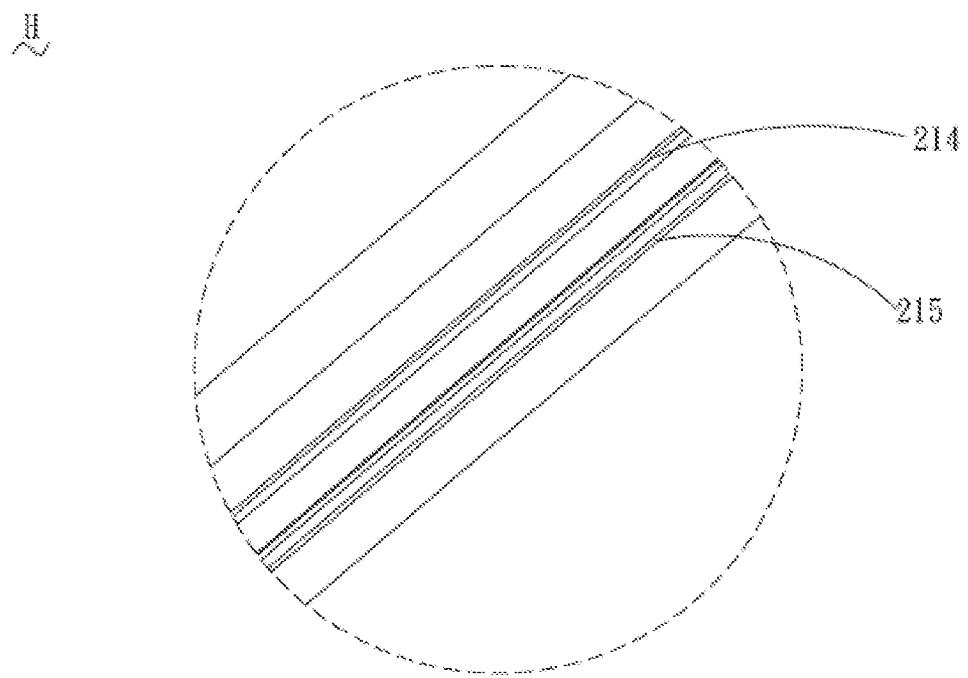
FIG. 19 is a partial enlarged schematic view for a portion H of the border frame of FIG. 17.

In the present embodiment, as shown in FIGS. 13 to 15, a section of the convex edge 11a on the middle plate 10a perpendicular to a longitudinal direction of the middle plate 10a is provided with a concave structure. An upper end of the convex edge 11a is provided with a first rib 13, and a lower end of the convex edge 11a is provided with a second rib 14. As shown in FIG. 19, the slot 23a comprises a first slot 214 corresponding to the first rib 214 and a second slot 215 corresponding to the second rib 14.

Furthermore, in the present embodiment, the first rib 13 and the second rib 14 are axially symmetrically arranged with respect to a vertical bisector in a thickness direction of the outer side of the peripheral edge of the middle plate 10. The angle formed by the first rib 13 and the second rib 14 is between 10° and 100°. In the embodiment, the angle is preferably 20°. In other embodiments, other values within this range may also be selected, such as 10°, 30°, 40°, 50°, 60°, 70°, 80°, 90° or 100°, etc. The advantage of this design is that when the press-fitting of the outer side of the border frame 20a is performed (the pressing direction is as indicated by the arrow in FIG. 13), since the border frame 20a made of titanium alloy has a large hardness, the deformation thereof is very small during the press-fitting process. Therefore, the middle plate 10a may be pressed by the border frame 20a, which may force the first rib 13 and the second rib 14 of the convex edge 11a to be deformed, so that the first slot and the second slot may be filled gradually, and finally the convex edge 11a and the slot 23A are riveted together. Moreover, in the press-fitting process, although there are some deformation to the middle portion of the middle plate 10a, the deformation quality is as small as negligible, which may reduce the press-fitting control difficulty of device. The riveting between the convex edge 11a and the slot 23a may be a seamless riveting, and a certain gap may also exist on the premise of ensuring the riveting stability between the middle plate 10a and the border frame 20a. It should be noted that, before press-fitting, the first rib 13 and the second rib 14 on the convex edge 11a are arranged in parallel with each other and are boss structures having a rectangular section, and the first slot 214 and the second slot 215 on the inner side of the border frame 20a are symmetrically arranged groove structures with rectangular sections (the first slot 214 and the second slot 215 are symmetrically and obliquely provided, and it is provided with a certain angle between the first slot 214 and the second slot 215, and the angle range is between 10° to 100°, preferably 20°). The overall width of the slot 23a is slightly larger than the overall width of the convex edge 11a, and the width of the first slot 214 is slightly larger than the width of the first rib 13, and the width of the second slot 215 is slightly larger than the width of the second rib 14, so that the convex edge 11a can easily enter the slot 23a. After press-fitting, under the action of the pressure, the convex edge 11a is pressed into the slot 23a, and the first rib 13 and the second rib 14 are deformed to respectively engage into the first slot 214 and the second slot 214 for the purpose of stabilizing the riveting.

It can be understood that, in this embodiment, the convex edge 11a may also be a convex ring provided around the outer side of the periphery of the middle plate 10a, and the slot 23a is a dovetail slot. The purpose of riveting may also be achieved by press-fitting the outer side of the border frame 20a to force the deformation of the middle plate 10a. The disadvantage of this solution is that compared with the design of the embodiment, the deformation quality of the middle plate 10a is higher during the press-fitting process, so that it is more difficult to control the press-fitting of device.

In the embodiment, the number of members is four and the members comprise a third member 216, a fourth member 217, a fifth member 218, and a sixth member 219 that are connected end to end in sequence. Wherein, the third member 216 and the fifth member 218 are both provided with U-shaped structure, and the fourth member 217 and the sixth member 219 are both provided with a straight sheet structure. The length of the third member 216 after being unfolded into a linear shape is equal to the length of the fifth member 218 after being unfolded into a linear shape, The fourth member 217 and the sixth member 219 are of equal length. The length of the fourth member 217 is greater than the length of the third member 216 after being unfolded into a linear shape.

Figure 17:
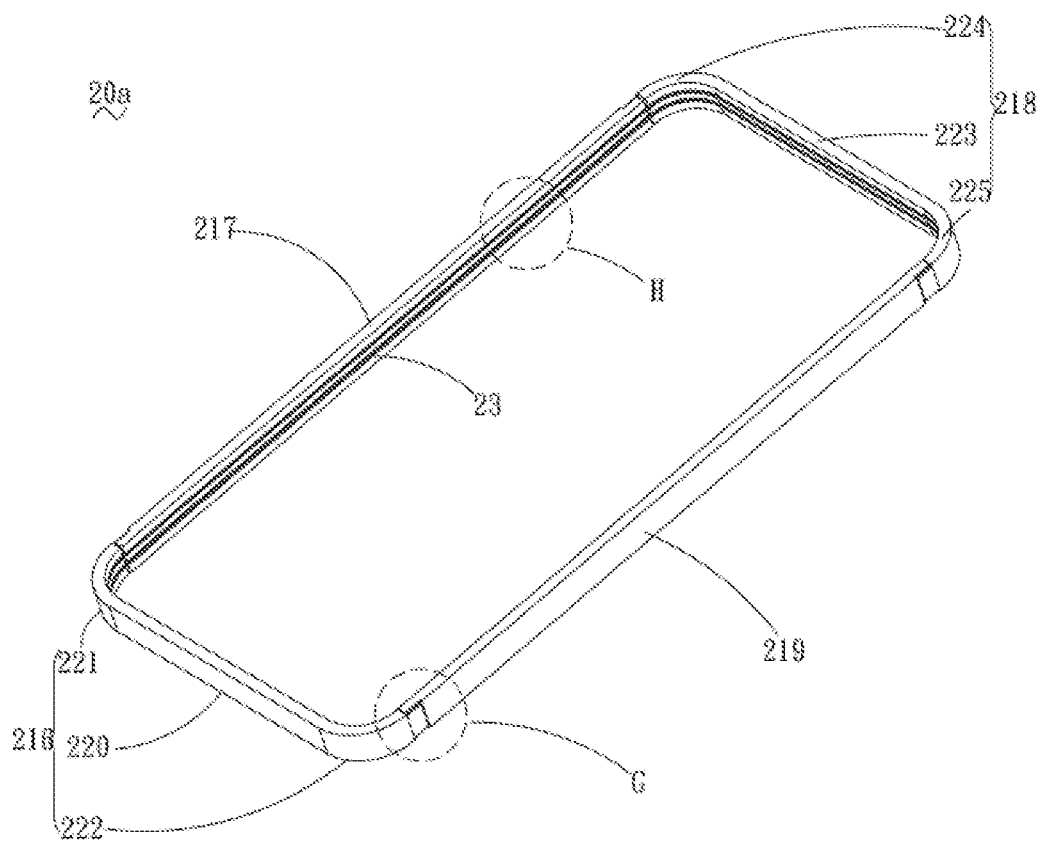
FIG. 17 is a schematic view of the border frame of FIG. 14.

Furthermore, as shown in FIG. 17, the third member 216 comprises a fifth straight segment 220, a fifth arc segment 221 connected to one end of the fifth straight segment 220, and a sixth arc segment 222 connected to another end of the fifth straight segment 220. The fifth member 218 comprises a sixth straight segment 223, a seventh arc segment 224 connected to one end of the sixth straight segment 223, and an eighth arc segment 225 connected to another end of the sixth straight segment 223. One end of the fourth member 217 is connected to an end of the fifth straight arc segment 221, and another end of the fourth member 217 is connected to an end of the seventh arc segment 224. One end of the sixth member 219 is connected to an end of the sixth arc segment 222, and another end of the sixth member 219 is connected to an end of the eighth arc segment 225. The fifth straight line segment 220 and the sixth straight line segment 223 are of equal length. The arc lengths and angles of the fifth straight arc segment 221, the sixth arc segment 222, the seventh arc segment 224, and the eighth arc segment 225 are equal in magnitude. When press-fitting, a press-fitting force is simultaneously applied to the border frame 20a from the outer side of the fifth straight segment 220, the outer side of the sixth straight segment 223, the outer side of the fourth member 217, and the outer side of the sixth member 219.

Figure 18:
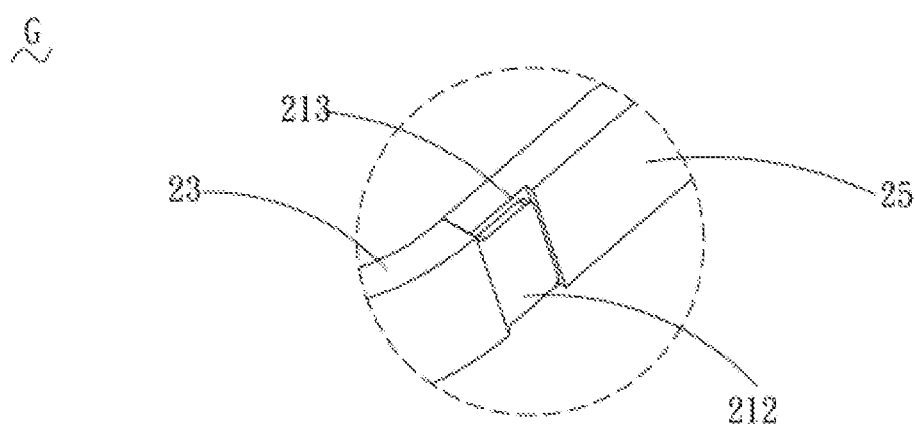
FIG. 18 is a partial enlarged schematic view for a portion G of the border frame of FIG. 17.

As shown in FIG. 18, the tabs are respectively provided on the ends of the third member 216 and the fifth member 218, and the step portions are provided on the ends of the fourth member 217 and the sixth member 219, so that when the members are assembled with the middle plate 10a, the two U-shaped members can hoop the two straight members, it is easy to assemble and position, which is beneficial to the subsequent press-fitting work.

The abovementioned riveted metal middle frame 100a adopts press-fitting to realize riveting between the middle plate 10a and the border frame 20a to form a middle frame. Wherein, the middle plate 10a is made of aluminum alloy, and the border frame 20a is made of titanium alloy, so that the hardness of the middle plate 10a is less than the hardness of the border frame 20a. When processing, the middle plate 10a made of aluminum alloy can reduce the loss of the cutting tool and be conducive to improve the speed for milling-finishing. The border frame 20a comprises a plurality of members connected end to end, and the inner sides of the members are provided with slot 23a, and correspondingly, the periphery of the middle plate 10a is provided with a convex edge 11a. When assembling, the members are abutted from the outer side of the middle plate 10a toward the periphery of the middle plate 10a. Then, the middle plate 10a is deformed by press-fitting the outer sides of the border frame 20a, so that a riveted state between the convex edge 11a and the slot 23a can be achieved. This way of assembly can reduce the amount of finishing work and waste generated. In the above design, the middle plate 10a made of aluminum alloy and the border frame 20a made of titanium alloy are riveted together by press-fitting deformation, thereby improving production efficiency and reducing manufacturing cost.

It should be noted that the riveting structure of the middle plate 10a and the border frame 20a shown in this embodiment is also applicable to the case where the border frame 20 is made of stainless steel or aluminum alloy.

The Fourth Embodiment

Figure 20:
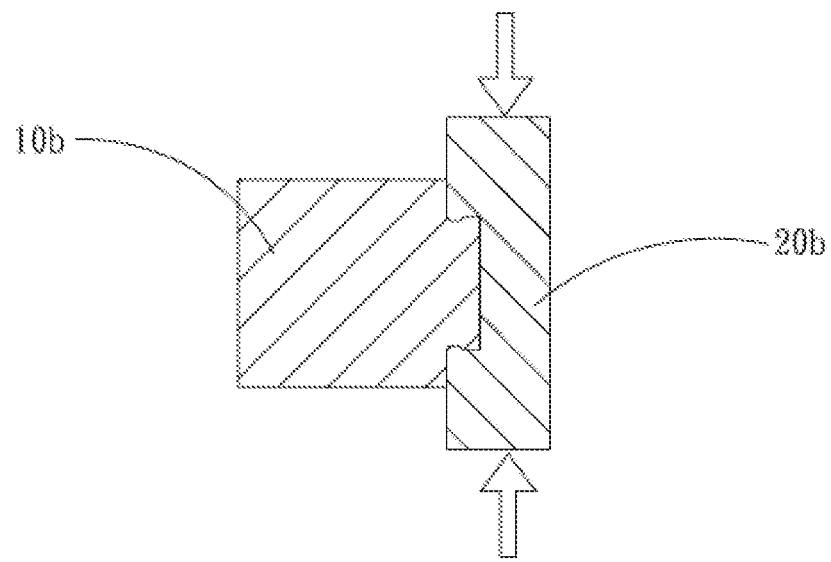
FIG. 20 is a sectional schematic view for joint of the middle plate and the border frame of the riveted metal middle frame according to a fourth embodiment of the present disclosure.
Figure 21:
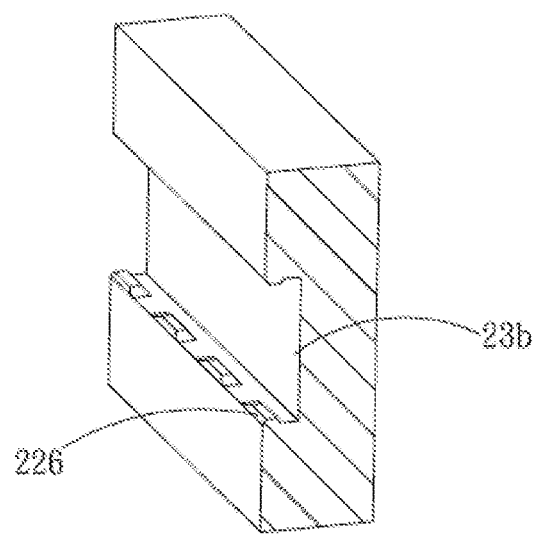
FIG. 21 is a partial schematic view of the border frame of FIG. 20.
Figure 22:
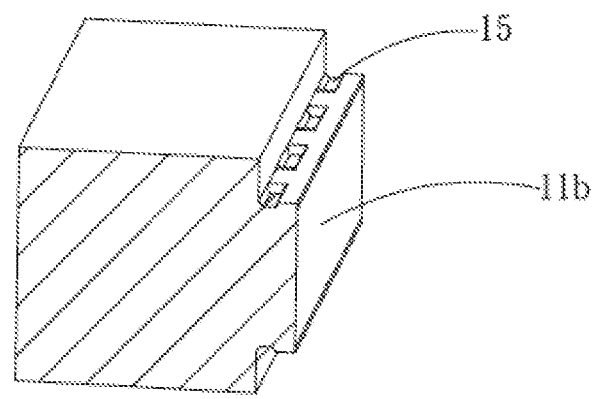
FIG. 22 is a partial schematic view of the meddle plate of FIG. 20.

Referring to FIGS. 20 to 22, it is a schematic view of a riveted metal middle frame of the present embodiment.

The difference between this embodiment and the first embodiment is that, before the press-fitting, the convex edge 11b of the middle plate 10b is a boss structure with rectangular section, and the slot 23b of the border frame 20b is a groove structure with rectangular section, and as shown in FIG. 21, zigzag convex teeth 226 are further provided on the opening of the slot 23b, and due to the presence of the convex teeth 226, the width of the opening of the slot 23b is smaller than the width of the inner cavity thereof. When press-fitting, pressure is applied to the upper and lower end faces of the border frame 20b, which forces the thickness of the border frame 20b to be compressed, and the slot 23b is narrowed accordingly. Under the squeezing of the border frame 20b, the convex edge 11b is also deformed, and as shown in FIG. 22, grooves 15 are formed on the convex edge 11b to engage the convex teeth 226. By engaging of the convex teeth 226 and the grooves 15, the middle plate 10b and the border frame 20b are tightly riveted together. Other structures are the same as those of the first embodiment, and the advantageous effects of the first embodiment can also be achieved.

It should be noted that the riveting structure of the middle plate 10a and the border frame 20a shown in this embodiment is also applicable to the case where the border frame 20a is made of titanium alloy or aluminum alloy.

Meanwhile, the present disclosure also provides an electronic device comprising the riveted metal middle frame of any of the above embodiments. Since the above-described riveted metal middle frame is used, it is improved the production efficiency of the electronic device and reduced the manufacturing cost thereof.

The technical features of the above-described embodiments may be combined arbitrarily. To simplify the description, all the possible combinations of the technical features in the above embodiments are not described. However, all of the combinations of these technical features should be considered as within the scope of the disclosure, as long as such combinations do not contradict with each other.

The above-mentioned embodiments are merely illustrative of several embodiments of the present disclosure, and the description thereof is relative specific and detailed, but they are not intended to limit the protection scope of the present disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

What is claimed is:
1. A riveted metal middle frame, comprising:
   a middle plate, wherein the middle plate is made of aluminum alloy, and a periphery of the middle plate is convexly provided with a convex edge; and
   a border frame riveted to the middle plate, wherein the border frame comprises a plurality of members connected end to end in sequence, the plurality of the members are connected end to end to form an enclosure frame structure that is sleeved on a periphery of the middle plate, each of the plurality of members is made of a metal material with a hardness not less than that of aluminum alloy, the plurality of members are riveted to the periphery of the middle plate, an inner side of each of the plurality of members is respectively provided with a slot for connecting the convex edge, and the convex edge is riveted to the slot by press-fitting the border frame.

2. The riveted metal middle frame of claim 1, wherein the plurality of members are connected together by welding.

3. The riveted metal middle frame of claim 2, wherein a gap is provided on a joint between two adjacent members of the plurality of members, and the gap is filled with a solder.

4. The riveted metal middle frame of claim 1, wherein the plurality of members are two members, which are first member and a second member, and the first member and the second member are each provided with a U-shaped structure.

5. The riveted metal middle frame of claim 4, wherein the length of the first member after being unfolded into a linear shape is less than the length of the second member after being unfolded into a linear shape.

6. The riveted metal middle frame of claim 5, wherein the first member is provided with a three-segment structure and comprises a first straight segment, a first arc segment connected to one end of the first straight segment, and a second arc segment connected to another end of the first straight segment, the second member is provided with a five-segment structure and comprises a second straight segment, a third arc segment connected to one end of the second straight segment, a fourth arc segment connected to another end of the second straight segment, a third straight segment connected to an end of the third arc segment away from the second straight segment, and a fourth straight segment connected to an end of the fourth arc segment away from the second straight segment, one end of the third straight segment away from the third arc segment is connected to the first arc segment, and one end of the fourth straight segment away from the fourth arc segment is connected to the second arc segment.

7. The riveted metal middle frame of claim 1, wherein the plurality of members are four members, which are a third member, a fourth member, a fifth member, and a sixth member that are connected end to end in sequence.

8. The riveted metal middle frame of claim 7, wherein the third member and the fifth member are both provided with U-shaped structure, and the fourth member and the sixth member are both provided with a straight sheet structure.

9. The riveted metal middle frame of claim 8, wherein the length of the third member after being unfolded into a linear shape is equal to the length of the fifth member after being unfolded into a linear shape, the fourth member and the sixth member are of equal length, the length of the fourth member is greater than the length of the third member after being unfolded into a linear shape.

10. An electronic device, comprising a riveted metal middle frame according to claim 1.

11. A riveted metal middle frame, comprising:
a middle plate, wherein the middle plate is made of aluminum alloy, and a periphery of the middle plate is convexly provided with a convex edge; and
a border frame riveted to the middle plate, wherein the border frame comprises a plurality of members sleeved on a periphery of the middle plate, the plurality of members are separated from each other to form at least two gaps, each of the plurality of members is made of a metal material with a hardness not less than that of aluminum alloy, the plurality of members are riveted to the periphery of the middle plate, an inner side of each of the plurality of members is respectively provided with a slot for connecting the convex edge, and the convex edge is riveted to the slot by press-fitting the border frame.

12. The riveted metal middle frame of claim 11, wherein the plurality of members are two members, which are a first member and a second member, and the first member and the second member are each provided with a U-shaped structure.

13. The riveted metal middle frame of claim 12, wherein the length of the first member after being unfolded into a linear shape is less than the length of the second member after being unfolded into a linear shape.

14. The riveted metal middle frame of claim 13, wherein the first member is provided with a three-segment structure and comprises a first straight segment, a first arc segment connected to one end of the first straight segment, and a second arc segment connected to another end of the first straight segment, the second member is provided with a five-segment structure and comprises a second straight segment, a third arc segment connected to one end of the second straight segment, a fourth arc segment connected to another end of the second straight segment, a third straight segment connected to an end of the third arc segment away from the second straight segment, and a fourth straight segment connected to an end of the fourth arc segment away from the second straight segment, one end of the third straight segment away from the third arc segment is faced to the first arc segment, and one end of the fourth straight segment away from the fourth arc segment is faced to the second arc segment.

15. The riveted metal middle frame of claim 10, wherein the plurality of members are four members, which are a third member, a fourth member, a fifth member, and a sixth member that are connected end to end in sequence.

16. The riveted metal middle frame of claim 15, wherein the third member and the fifth member are both provided with U-shaped structure, and the fourth member and the sixth member are both provided with a straight sheet structure.

17. The riveted metal middle frame of claim 16, wherein the length of the third member after being unfolded into a linear shape is equal to the length of the fifth member after being unfolded into a linear shape, the fourth member and the sixth member are of equal length, the length of the fourth member is greater than the length of the third member after being unfolded into a linear shape.

18. The riveted metal middle frame of claim 11, wherein in manufacturing process, the plurality of members are connected together by welding or locking, and formed at least two connecting portions therein.

19. The riveted metal middle frame of claim 18, wherein the at least two connecting portions are cut by milling tool to form the gaps for separating the plurality of members from each other.

* * * * *